(12) United States Patent
Komulainen et al.

(10) Patent No.: US 10,491,026 B2
(45) Date of Patent: Nov. 26, 2019

(54) IMPEDANCE MATCHING MULTIPLE COILS IN AN ELECTRONIC DEVICE

(71) Applicant: INTEL CORPORATION, Santa Clara, CA (US)

(72) Inventors: Mikko S. Komulainen, Tampere (FI); Saku Lahti, Tampere (FI); Songnan Yang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 701 days.

(21) Appl. No.: 15/086,837

(22) Filed: Mar. 31, 2016

(65) Prior Publication Data
US 2017/0288444 A1 Oct. 5, 2017

(51) Int. Cl.
| | |
|---|---|
| H02J 7/00 | (2006.01) |
| H02J 7/02 | (2016.01) |
| H02J 50/80 | (2016.01) |
| H02J 50/10 | (2016.01) |
| H03H 7/38 | (2006.01) |
| H02J 50/40 | (2016.01) |
| H02J 50/12 | (2016.01) |

(52) U.S. Cl.
CPC .............. *H02J 7/025* (2013.01); *H02J 50/10* (2016.02); *H02J 50/12* (2016.02); *H02J 50/40* (2016.02); *H02J 50/80* (2016.02); *H03H 7/38* (2013.01)

(58) Field of Classification Search
CPC .. H02J 50/10; H02J 50/12; H02J 7/025; H02J 5/005; H03H 7/38
USPC ........................................................ 320/108
See application file for complete search history.

(56) References Cited

U.S. PATENT DOCUMENTS

| | | |
|---|---|---|
| 8,489,198 B2 | 7/2013 | Cantatore et al. |
| 2014/0232334 A1 | 8/2014 | Konanur et al. |
| 2014/0375258 A1 | 12/2014 | Arkhipenkov et al. |
| 2016/0134154 A1* | 5/2016 | Baarman ................ H02J 5/005 |
| | | 320/108 |

(Continued)

FOREIGN PATENT DOCUMENTS

| | | |
|---|---|---|
| JP | 2010-524621 A | 7/2010 |
| KR | 10-1445082 B1 | 10/2014 |
| WO | 2009-122355 A2 | 10/2009 |

OTHER PUBLICATIONS

International Search Report and Written Opinion dated Jun. 5, 2017, on application No. PCT/US2017/020272.

*Primary Examiner* — Paul Dinh
(74) *Attorney, Agent, or Firm* — Lowenstein Sandler LLP

(57) ABSTRACT

Technology for impedance matching with a re-configurable coil arrangement of multiple transmitter coils of an electronic device is described. One electronic device includes a wireless transmitter coupled to a power supply and an impedance matching circuit coupled to output terminals of the wireless transmitter. First switching circuitry of the impedance matching circuit, in response to a first control signal, is to switch either a first transmitter coil or a first conductive path in series between the output terminals. Second switching circuitry of the impedance matching circuit, in response to a second control signal, is to switch either a second transmitter coil or a second conductive path in series between the output terminals. The first transmitter and first conductive path have the same impedance and the second transmitter and the second conductive path have the same impedance.

11 Claims, 11 Drawing Sheets

(56) References Cited

U.S. PATENT DOCUMENTS

2016/0204645 A1* 7/2016 Mitcheson .............. H02J 17/00
                                                                         320/108

* cited by examiner

IMPEDANCE MATCHING MULTIPLE COILS IN AN ELECTRONIC DEVICE

TECHNICAL FIELD

This disclosure generally relates to impedance matching multiple transmitter coils in an electronic device, and more particularly to systems and methods for impedance matching multiple transmitter coils in a wireless charger.

BACKGROUND

Mobile devices have become an integral part of the computing landscape. As mobile devices become more capable, they have shifted to perform tasks that have traditionally been performed by non-mobile computers. In one example, mobile devices may have the ability to stream media, display videos, or otherwise process large amounts of data over the course of a day. The increasing use of mobile devices by consumers, along with the high dynamic range of power consumption across mobile devices, may cause certain components of the mobile device to wear down, such as the battery. In some instances, certain applications of mobile devices may consume large portions of the battery powering the mobile device, resulting in a frequent need to charge the mobile device.

Recent developments in wireless charging technology enable a user to arrange one or more devices on, or near, a wireless charging station (e.g., a table surface with embedded wireless charging coils). The wireless charging station can charge the device(s) using wireless power transfer (WPT). Wireless power charging systems are based on transferring power using a magnetic field coupling between the two devices. In particular, a transmitter device, which is connected to a power source (e.g., an alternating-current (AC) electric power supply), can convert power from the power source into a time-varying electromagnetic field by a transmitter coil. A receiver device uses a receiver coil to convert the time-varying electromagnetic field back to electric power (e.g., direct current (DC) or AC) that can be consumed or stored by the receiver device. Wireless charging systems can form the magnetic field coupling between coils using loosely-coupled wireless charging coils or tightly-coupled wireless charging coils. In loosely-coupled systems, a small portion of magnetic flux of a transmitter coil flows thru a receiver coil, resulting in a notable size difference between the coils. Loosely-coupled system may not be sensitive to device alignment on a surface of the wireless charging station (also referred to as a pad) and can be used for charging multiple devices concurrently. Some loosely-coupled systems can exhibit poor efficiency, heating of the device, and may even charge other electronics inadvertently based on loose magnetic coupling. In tightly-coupled systems, a major part of the magnetic flux of the transmitter coil flows thru the receiver coil. In tightly-coupled systems, the coils need to be roughly equal in size and aligned to each other during operation. In some systems, instead of using a larger loosely-coupled coil, multiple smaller coils with tight coupling can be used to charge the device. Power is driven only to coils that are used for charging the one or more devices.

DESCRIPTION OF IMPLEMENTATIONS

Figure 1:
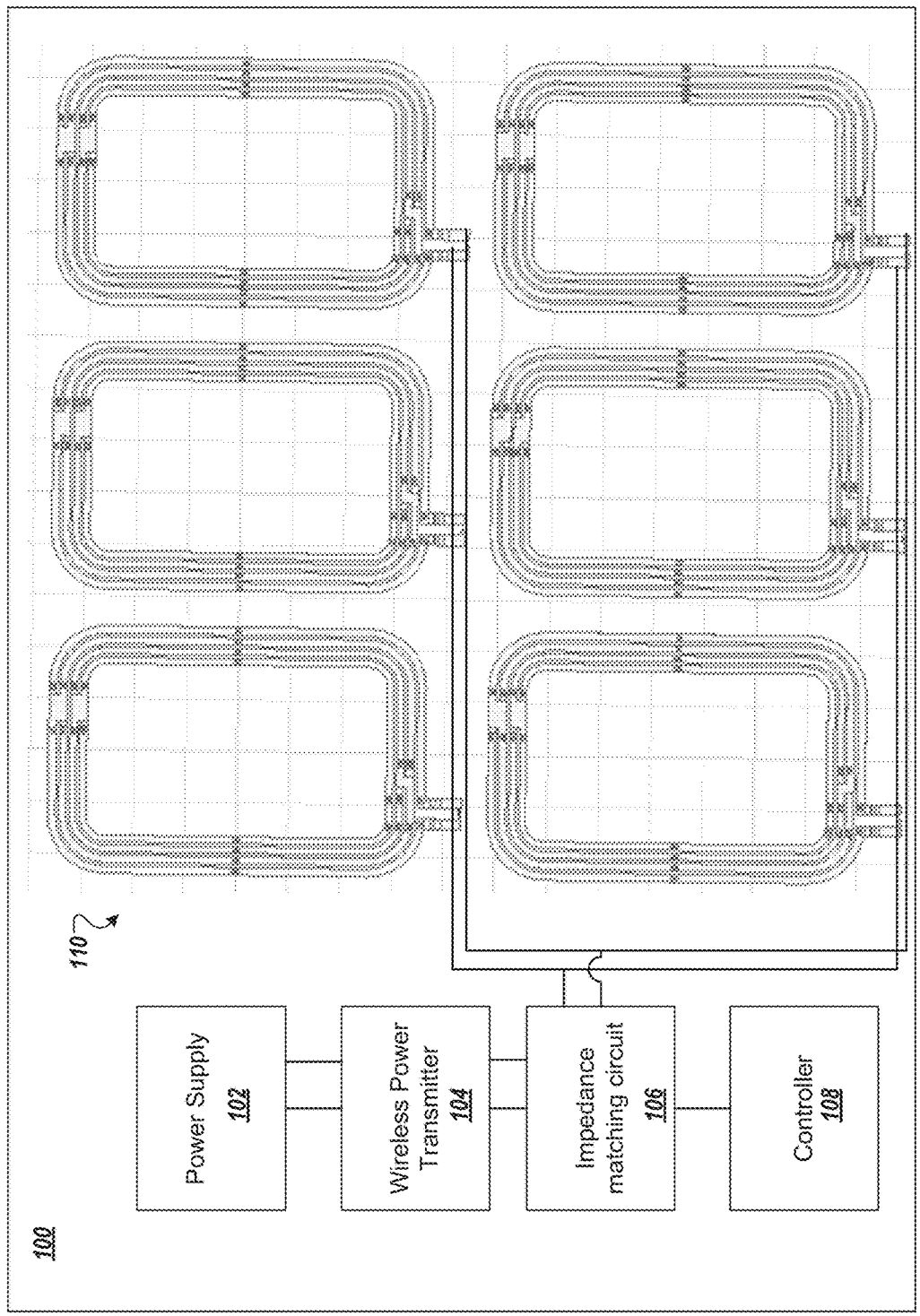
FIG. 1 illustrates a wireless charger with multiple transmitter coils and an impedance matching circuit according to one implementation.

Technology for impedance matching with a re-configurable coil arrangement of multiple transmitter coils in an electronic device is described. In one implementation, an electronic device includes a wireless transmitter coupled to a power supply, the wireless transmitter having a first terminal and a second terminal. An impedance matching circuit, which is coupled to the first and second terminals, includes: a first transmitter coil having a first impedance; a second transmitter coil having a second impedance; a first conductive path (also referred to herein as a bypass signaling path) having a third impedance to match the first impedance; a second conductive path having a fourth impedance to match the second impedance; first switching circuitry; and second switching circuitry. The first switching circuitry, in response to a first control signal, is to switch either the first transmitter coil or the first conductive path in series between the first terminal and the second terminal. The second switching circuitry, in response to a second control signal, is to switch either the second transmitter coil or the second conductive path in series between the first terminal and the second terminal.

The implementations described herein may be used in connection with a wireless power transmitter, as well as other near field type transmitters, such as a near field communication (NFC) transmitter. Various implementations described herein are primarily directed to impedance matching of re-configurable wireless charging transmitter coil arrangements of multiple coils, but these implementations may also be used for impedance matching of re-configurable transmitter coil arrangements of multiple coils. Re-configurability in this context means that circuitry can be used to change the impedance seen by a wireless transmitter. The impedance seen by the transmitter can change based on changes in geometry of one or more coils, a number of coils being used, a combination of coils being used, change in load caused by proximity of a receiver coil, or the like. In order to maintain optimal impedance matching, the re-configurability of the circuitry between the transmitter and coil can accommodate the changes in impedance seen by the wireless transmitter. For example, with respect to impedance, wireless charging coils are inductances and typically capacitor components are needed in the impedance matching. Some wireless power chargers use a discrete radio frequency (RF) switch and capacitor components in a matching circuit coupled to the charging coil to create variable capacitor components. Also, other kinds of variable capacitor component with appropriate properties can be used.

As described herein, implementations of the impedance matching circuit can keep impedance, as seen between output terminals of a wireless transmitter, constant in all arrangements of the multiple coils. That is, different combinations of the multiple coils can be switched in series between the output terminals, and regardless of which of the multiple coils are switched in series, the impedance matching circuit can maintain the impedance between the output terminals in the different combinations of coil arrangements (also referred to as states or transmit modes). The impedance matching circuit can use a corresponding bypass signaling path with each of the multiple coils. For example, there may be a discrete inductor disposed on the bypassing signaling path with an inductance equal to an inductance of the corresponding transmitter coil being bypassed. In other implementations, the series inductor can be replaced with a circuit including multiple passive components that create the same or similar impedance response as the transmitter coil being bypassed. The impedance matching circuit can create re-configurable coil arrangements for which the impedance seen from a wireless power transmitter is kept constant in the various combinations of coil arrangements. With the impedance matching circuit, the impedance seen at the wireless power transmitter is not dependent on how many coils or which coil is used for the transmitting (e.g., charging). The impedance matching of the selected coil arrangement by the impedance matching circuit becomes simple and the impedance matching circuit can accommodate the re-configurability of the coil arrangements.

In the following description, numerous specific details are set forth, such as examples of specific types of processors and system configurations, specific hardware structures, specific architectural details, specific system components, specific measurements, operations, etc. in order to provide a thorough understanding of the present implementations. It will be apparent, however, to one skilled in the art that these specific details need not be employed to practice the various implementations. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the described implementations.

Although the following implementations may be described with reference to components in specific integrated circuits, such as in wireless charging systems, transmitter devices (e.g., power transmitting unit (PTU), base station, or the like), or other implementations are applicable to other types of integrated circuits and logic devices. Similar techniques and teachings of implementations described herein may be applied to other types of circuits or semiconductor devices that may also benefit from the impedance matching circuit. For example, the disclosed implementations are not limited to wireless chargers, but may be also used in other electronic devices with wireless transmitters and multiple transmitter coils that can be operated in different combinations of coil arrangements.

FIG. 1 illustrates a wireless charger 100 with multiple transmitter coils 110 and an impedance matching circuit 106 according to one implementation. The wireless charger 100 includes a power supply 102, a wireless power transmitter 104 having two terminals, the impedance matching circuit 106, and a controller 108. The power supply is to supply power to the wireless power transmitter 104 to transfer power to another electronic device using transmitter coils 110. As described above, the wireless charger 100 can transfer power to a receiving device using a wireless coupling (e.g., a magnetic field coupling, an electromagnetic field coupling, a RF field coupling, an inductive field coupling, or the like) between the wireless charger 100 and the receiving device. The power supply 102 is typically coupled to an AC or DC electric power supply, such as mains power line, but could also be coupled to a battery or other power source. The wireless power transmitter 104 converts power from the power supply 102 into a time-varying electromagnetic field by one or more of the transmitter coils 110. A receiver device (not illustrated in FIG. 1) uses a receiver coil to convert the time-varying electromagnetic field back to electric power (e.g., DC or AC) that can be consumed or stored by the receiver device. Alternatively, the wireless power transmitter 104 can create an electromagnetic field for communication, as well as power transfer, such as in some NFC devices. The receiver device may be a battery-operated device. As described above, wireless charging systems can form the magnetic field coupling between coils using loosely-coupled wireless charging coils or tightly-coupled wireless charging coils. The implementations described herein use multiple transmitter coils and corresponding impedance matching arrangements to improve power transfer efficiency, flexibility in device alignment, charging multiple devices, or the like. The implementations described herein may exhibit good efficiency, may reduce heating of the device, or the like.

The impedance matching circuit 106 is coupled between the first terminal and the second terminal of the wireless power transmitter 104 and multiple transmitter coils 110. The impedance matching circuit 106 may include multiple corresponding conductive paths (also referred to herein as bypass signaling paths) that have impedances that match corresponding impedances of the transmitter coils 110. For example, impedance matching circuit 106 may include six conductive paths, where individual ones of the conductive paths correspond to individual ones of the transmitter coils 110 as illustrated in the depicted implementation. The impedances of the individual transmitter coils 110 and the corresponding bypass signaling paths can be matched by designing the conductive path to have the same inductance as the individual transmitter coil. Alternatively, the electrical properties of the individual transmitter coils, the bypass signaling paths, or both can be designed to present the same impedance regardless of whether the individual transmitter coil is selected or the corresponding bypass signaling path is selected. For example, a capacitor can be disposed in series with the individual transmitter coil and the bypass signaling path may be an electrical short. In this implementation, the series capacitor (also referred to as an in-line capacitor), which his disposed in series with the individual transmitter coil when using a short circuit on the bypass signaling path, resonates with the individual transmitter coil. For operation, just like the inductor in the bypass signaling path can replace, or otherwise substitute, the reactive part of the transmitter coil, the series inductor with a short-circuit bypass signaling path cancel the reactive part of the transmitter coil. For example, in the inductor switching case, the goal is to cancel out the inductance using a negative reactance to compensate for positive reactance, but to substitute it with a different inductor.

The switching circuitry is coupled to the transmitter coils 110. The impedance matching circuit 106 can be controlled by the controller 108. The controller 108 may determine a first subset of the transmitter coils 110 to transfer wireless power and a second subset of the transmitter coils 110 that is not to transfer wireless power. The controller 108 can determine the second subset as the remaining transmitter coils 110 that are not in the first subset. Alternatively, the controller 108 can specifically identify which transmitter coils are selected for the first subset and specifically identify which transmitter coils are not selected for the second subset. The controller 108 switches the first subset of transmitter coils and a third subset of the conductive traces into series between the first terminal and the second terminal of the wireless power transmitter 104. The third subset of the conductive paths corresponds to the second subset of the transmitter coils 110, which are not selected to transmit wireless power. The controller 108 can switch the respective ones of the transmitter coils 110 and the respective ones of the conductive paths using the switching circuitry in the impedance matching circuit 106. For example, the controller 108 may send one or more signals to the switching circuitry to select individual transmitter coils to transfer power and may send one or more signals to the switching circuitry to select individual conductive paths corresponding to the transmitter coils that are not selected to transfer power. In this manner, the impedance matching circuit 106 can maintain impedance across the terminals of the wireless power transmitter 104 regardless of which ones of the transmitter coils 110 are selected to transfer power.

As described and illustrated with respect to FIGS. 2A-3B, the impedance matching circuit 106 includes switching circuitry and conductive paths. In some cases, the impedance matching circuit 106 can include the switching circuitry, conductive paths, and the transmitter coils 110. For example, each transmitter coil can have a corresponding conductive trace to make up a power transfer circuits. In each power transfer circuit, a transmitter coil and its corresponding conductive path have electrical characteristics that are the same or similar. For example, the conductive path may have an inductance (e.g., a discrete inductor component disposed in series along the conductive path) that is the same or similar to the corresponding transmitter coil in the power transfer circuit. As such, regardless of whether the transmitter coil or the conductive path of the power transfer circuit is selected, impedance seen at the terminals of the wireless power transmitter 104 is the same. Thus, the conductive path and the corresponding transmitter coil operate as a unit, referred to herein as a power transfer circuit. Multiple power transfer circuits can be disposed in series as described herein. Regardless of which combination of transmitter coils and conductive paths are selected in the multiple power transfer circuits, the impedance remains the same for the wireless power transmitter 104. Different implementations of a re-configurable coil arrangement of two transmitter coils are described below with respect to FIGS. 2-3. In other implementations, the impedance matching circuit 106 can be used in other electronic devices where a wireless transmitter can use different combinations of transmitter coils.

Wireless charging permits battery-operated devices to be charged without wires. Current wireless charging solutions are based on transferring power using magnetic field coupling between receiver and transmitter coils. One category of wireless charging systems can be loosely-coupled wireless charging coils. In this category, the receiver coil is smaller than a larger transmitter coil. In loosely-coupled systems, small portion of magnetic flux of the transmitter coils flows thru the receiver coil. This means there can be notable size difference between the coils. Therefore the system is not sensitive to device alignment on a charging pad and the charging pad can be used for charging multiple devices at time. Currently there are many fundamental type problems e.g. poor efficiency, heating of device and charging electronics associated to systems based on loose magnetic coupling. In tightly-coupled systems, a major part of the magnetic flux of the transmitter coil flows thru the receiver. In these systems, the coils needs to be roughly equal in size and aligned to each other during the operation. The charging pad of the tight magnetic field coupling based systems may incorporate several coils and a system selects which one of these are used for the charging.

Figure 2A:
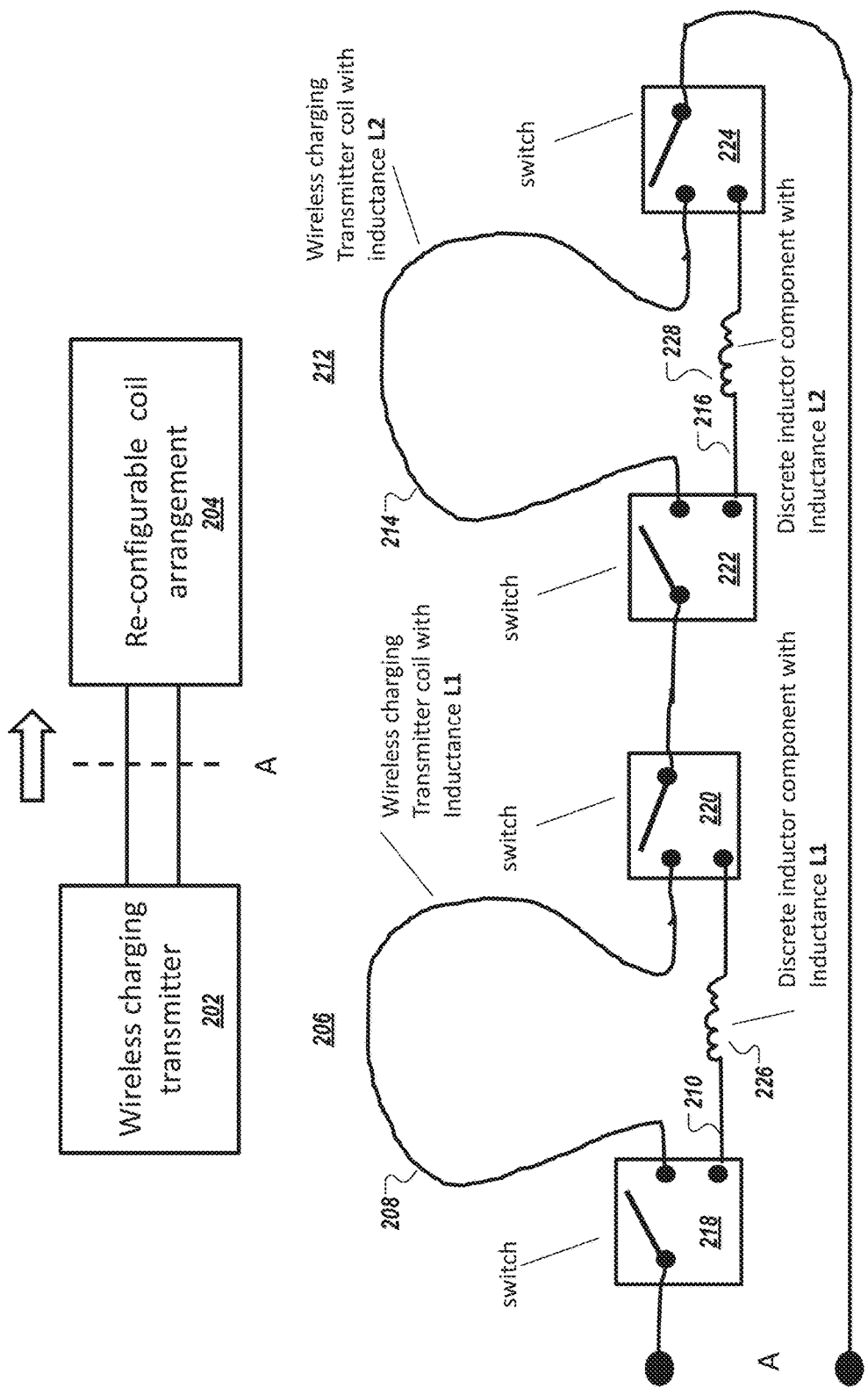
FIG. 2A is a block diagram of a re-configurable coil arrangement of two transmitter coils according to a first exemplary implementation.

FIG. 2A is a block diagram of a re-configurable coil arrangement of two transmitter coils according to a first exemplary implementation. In FIG. 2A, a wireless charging transmitter 202 is to transfer power using a re-configurable coil arrangement 204. One or more different coil arrangements of two transmitters can be achieved with the re-configurable coil arrangement 204. These arrangements can be different arrangements of two power transfer circuits 206 and 212.

A first power transfer circuit 206 includes a first transmitter coil 208 and a first bypass signaling path 210. The first bypass signaling path 210 has a first impedance that matches a second impedance of the first transmitter coil 208. A second power transfer circuit 212 includes a second transmitter coil 214 and a second bypass signaling path 216. The second bypass signaling path 216 has a third impedance that matches a fourth impedance of the second transmitter coil 214. A controller (not illustrated in FIG. 2A) can control switching circuitry to switch the first transmitter coil 208 in series with the second transmitter coil 214 in a first transmit mode. The controller can also control the switching circuitry to switch the first transmitter coil 208 in series with the second bypass signaling path 216 in a second transmit mode. The controller can also control the switching circuitry to switch the second transmitter coil 214 in series with the first bypass signaling path 210 in a third transmit mode. The controller can also control the switching circuitry to switch the first bypass signaling path 210 in series with the second bypass signaling path 216 in a fourth transmit mode. This may be done when there are more than the two transmitter coils.

In one exemplary implementation, the switching circuitry may include first switching circuitry coupled to the first transmitter coil 208 and the first bypass signaling path 210 and second switching circuitry coupled to the second transmitter coil 214 and the second bypass signaling path 216. The first switching circuitry, in response to a first control signal, is to switch either the first transmitter coil 208 or the first conductive path 210 in series between a first terminal and a second terminal (labeled as "A" in FIG. 2A) of the wireless charging transmitter 202. The second switching circuitry, in response to a second control signal, is to switch either the second transmitter coil 214 or the second bypass signaling path 216 in series between the first terminal and the second terminal. As such, the impedance presented at terminals to the wireless charging transmitter 202 can be maintained by the re-configurable coil arrangement 204, regardless of whether the first transmitter coil 208, the second transmitter coil 214, or both are selected to transfer power.

In another exemplary implementation, as illustrated in FIG. 2A, the switching circuitry may include a first single pole, double throw (SPDT) switch 218 with a first terminal, a second terminal, and a third terminal; a second SPDT switch 220 with a first terminal, a second terminal, and a third terminal; a third SPDT switch 222 with a first terminal, a second terminal, and a third terminal; and a fourth SPDT switch 224 with a first terminal, a second terminal, and a third terminal. The first transmitter coil 208 is coupled between the second terminal of the first SPDT switch 218 and the second terminal of the second SPDT switch 220. The first bypass signaling path 210 (e.g., first conductive path) is coupled between the third terminal of the first SPDT switch 218 and the third terminal of the second SPDT switch 220. The first terminal of the first SPDT switch 218 is coupled to the first terminal of the wireless charging transmitter 202. The second transmitter coil 214 is coupled between the second terminal of the third SPDT switch 222 and the second terminal of the fourth SPDT switch 224. The second bypass signaling path 216 (e.g., a second conductive path) is coupled between the third terminal of the third SPDT switch 222 and the third terminal of the fourth SPDT switch 224. The first terminal of the third SPDT switch 222 is coupled to the first terminal of the second SPDT switch 220, and the first terminal of the fourth SPDT switch 224 is coupled to the second terminal of the wireless charging transmitter 202.

In a first exemplary implementation, as illustrated in FIG. 2A, the re-configurable coil arrangement 204 includes a first inductor component 226 disposed on the first bypass signaling path 210 and a second inductor component 228 disposed on the second bypass signaling path 216. The first inductor component 226 has the same or similar inductance as the first transmitter coil 208. The second inductor component 228 has the same or similar inductance as the second transmitter coil 214. In other implementations, the impedance can be matched by using different implementations of switching circuitry, such as the re-configurable coil arrangements of two transmitter coils illustrated and described with respect to FIG. 2B.

Figure 2B:
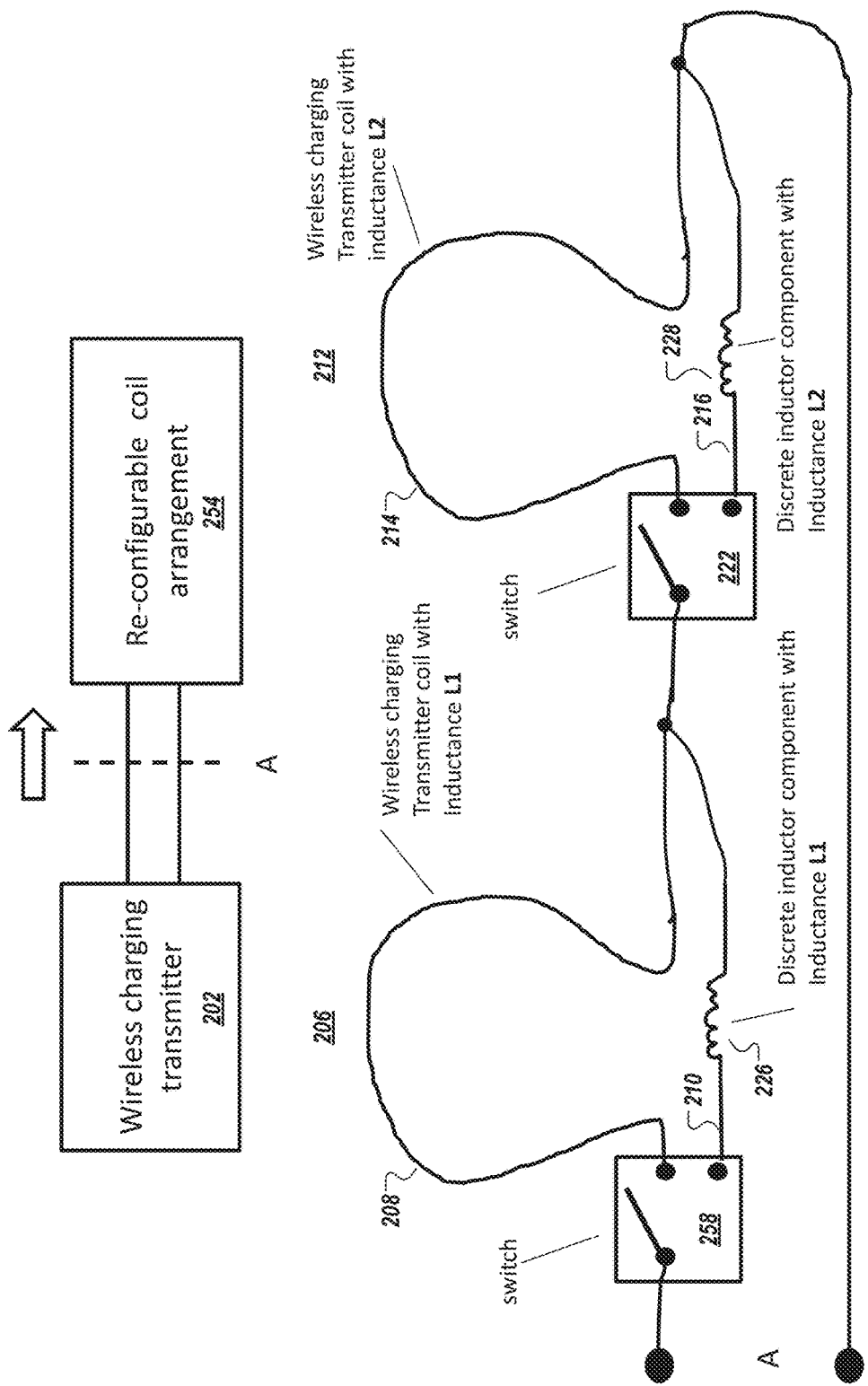
FIG. 2B is a block diagram of a re-configurable coil arrangement of two transmitter coils according to a second exemplary implementation.

FIG. 2B is a block diagram of a re-configurable coil arrangement 254 of two transmitter coils according to a second exemplary implementation. The re-configurable coil arrangement 254 in FIG. 2B is similar to the re-configurable coil arrangement 204 in FIG. 2A as noted by similar reference numbers. The first switching circuitry in FIG. 2B, however, includes a first SPDT switch 258 with a first terminal, a second terminal, and a third terminal, but does not includes a second SPDT switch 220 as done in FIG. 2A. Similarly, the second switching circuitry in FIG. 2B, however, includes a second SPDT switch 262 with a first terminal, a second terminal, and a third terminal, but does not includes a fourth SPDT switch 224 as done in FIG. 2A.

In one implementation, the first SPDT switch 258 includes a first terminal, a second terminal, and a third terminal. The first transmitter coil 208 is coupled to the second terminal of the first SPDT switch 258. The first conductive path 210 is coupled to the third terminal of the first SPDT switch 258. The first terminal of the first SPDT switch 258 is coupled to the first terminal of the wireless transmitter 202. The second SPDT switch 262 includes a first terminal, a second terminal, and a third terminal. The second transmitter coil 214 is coupled to the second terminal of the second SPDT switch 262. The second conductive path 216 is coupled to the third terminal of the second SPDT switch 262. The first terminal of the second SPDT switch 262 is coupled to the first conductive path 210 and the first transmitter coil 208.

Figure 3A:
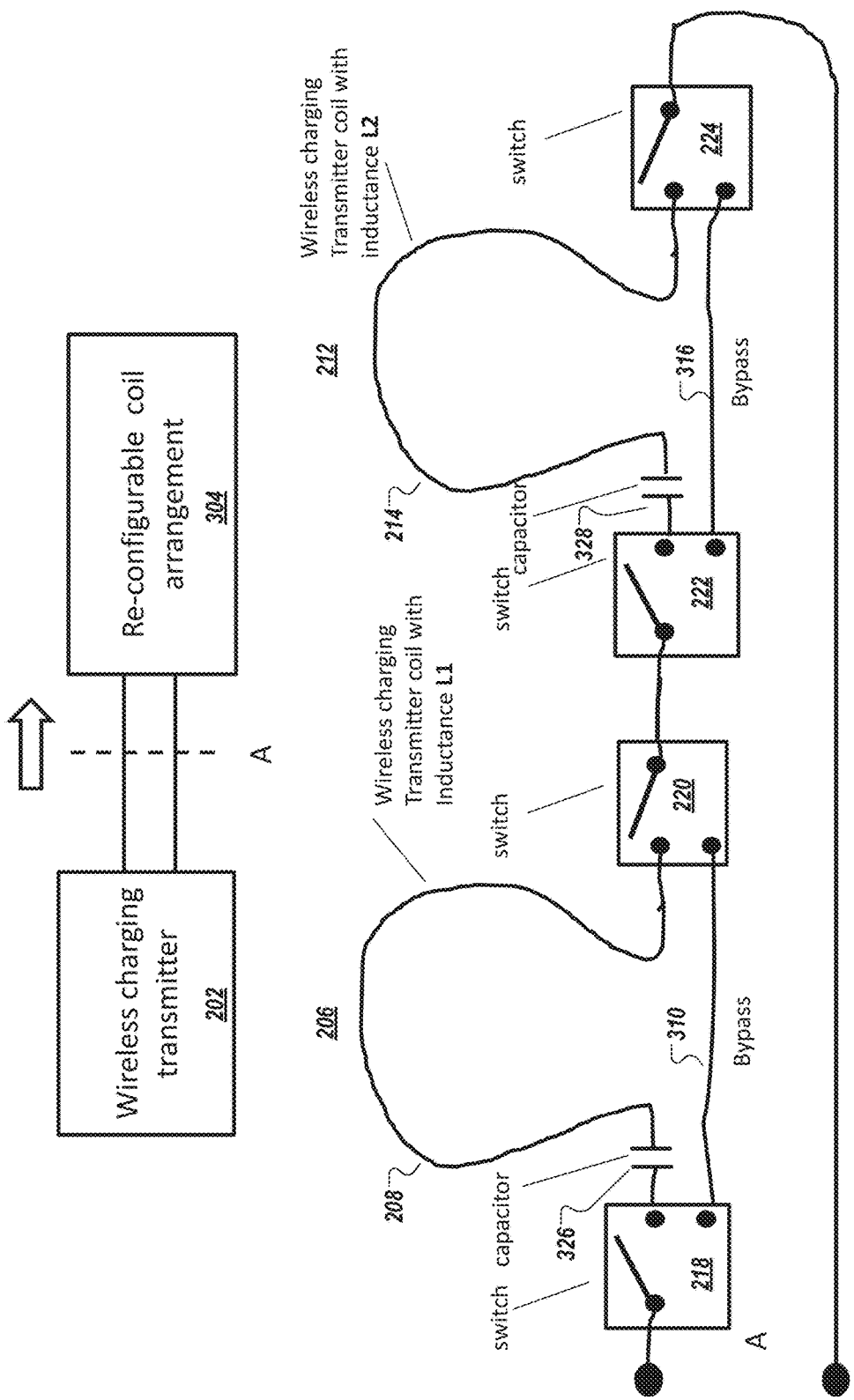
FIG. 3A is a block diagram of a re-configurable coil arrangement of two transmitter coils according to a third exemplary implementation.

In other implementations, the impedance can be matched by changing other electrical properties of the power transfer circuits, such as illustrated and described with respect to FIG. 3A.

FIG. 3A is a block diagram of a re-configurable coil arrangement 304 of two transmitter coils according to a third exemplary implementation. In FIG. 3A, the wireless charging transmitter 202 is to transfer power using a re-configurable coil arrangement 304 of the two power transfer circuits 206 and 212. The power transfer circuits 206 and 212 are similar to those described above with respect to FIGS. 2A-2B, except as expressly described otherwise. In the implementation illustrated in FIG. 3A, re-configurable coil arrangement 304 may include shorted bypass signaling paths 310, 316 and capacitors 326, 328 being disposed in series with the transmitter coils 208, 214, respectively. For example, the first bypass signaling path 310 is coupled between the third terminals of the first and second SPDT switches 218, 220 and the second bypass signaling path 316 is coupled between the third terminals of the third and fourth SPDT switches 222, 224. The first bypass signaling path 310 and second bypass signaling path 316 are electrical short paths. These electrical short paths may be conductive traces that have no discrete electrical components disposed on the respective conductive trace. Alternatively, the electrical shorts may be wires. The re-configurable coil arrangement 304 may include a first capacitor component 326 disposed in series with the first transmitter coil 208 and a second capacitor component 328 disposed in series with the second transmitter coil 214.

The implementations described in FIGS. 1-3B are directed to wireless power transmitters of wireless chargers. The wireless chargers utilize different interface standards to wirelessly transfer power. For example, the wireless charger can support the wireless charging standards, such as the Rezence standard by the Alliance for Wireless Power (A4WP), such as A4WP Wireless Power Transfer System Baseline System Specification (BSS) V1.3 or V1.4. Alternatively, the wireless charger can support other wireless charging standards, such as those using the AirFuel® technology developed by the AirFuel® Alliance. For another example, the wireless charger can support the Qi standard by the Wireless Power Consortium, where a base station transfers wireless electrical power. Although these standards utilize different technology and techniques, as noted in FIG. 4 and FIG. 5, the impedance matching circuit can be used in connection with either standard, as well as other interface standards for wireless power transfer.

Figure 3B:
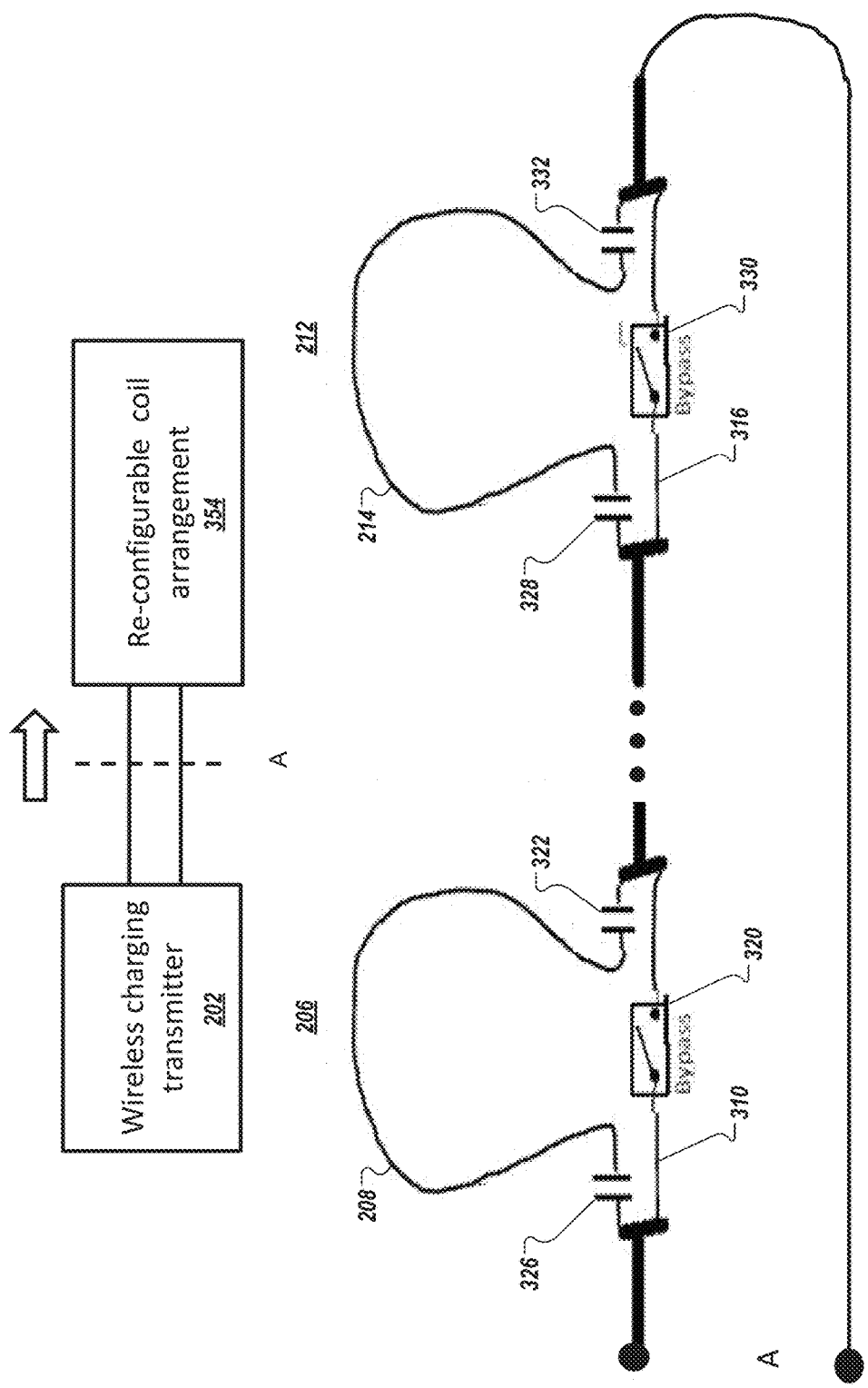
FIG. 3B is a block diagram of a re-configurable coil arrangement of two transmitter coils according to a fourth implementation.

FIG. 3B is a block diagram of a re-configurable coil arrangement of two transmitter coils according to a fourth implementation. The re-configurable coil arrangement 354 in FIG. 3B is similar to the re-configurable coil arrangement 304 in FIG. 3A as noted by similar reference numbers. The re-configurable coil arrangement 354, however, includes a first bypass switch 320 disposed in the first bypass signaling path 310, corresponding to the first transmitter coil 208, and a second bypass switch 330 disposed in the second bypass signaling path 316, corresponding to the second transmitter coil 214. The first transmitter coil 208 is disposed between a series capacitor 326 and a series capacitor 322. The second transmitter coil 214 is disposed between a series capacitor 328 and a series capacitor 332. In some of the implementations above, the switching circuitry is used to select either the transmitter coil or the bypass signaling path. In this implementation, however, both the transmitter coil and the bypass signaling path are both physically connected to the terminals of the wireless transmitter, and the switching circuitry, such as a simple SPST switch (e.g., bypass switch 320) can be used to activate a short circuit without disconnecting the transmitter coil. The signal automatically flows along the bypass signal path that is shorted by the SPST, which effectively disables the transmitter coil.

In one specific implementation, a first transmitter coil is disposed between a first series capacitor and a second series capacitor and a second transmitter coil is disposed between a third series capacitor and a fourth series capacitor. The switching circuitry includes a first SPST switch disposed on a first conductive path between a first node and a second node, the first node being coupled to the first series capacitor and the second node being coupled to the second series capacitor. The second switching circuitry includes a second SPST switch disposed on the second conductive path between a third node and a fourth node, the third node being coupled to the third series capacitor and the fourth node being coupled to the fourth series capacitor. When the first transmitter coil and the second transmitter coil are adjacent transmitter coils, the third node is coupled to the fourth mode. However, in other implementations, there may be one or more intervening transmitter coils disposed in series between the first transmitter coil and the second transmitter coil.

Figure 4:
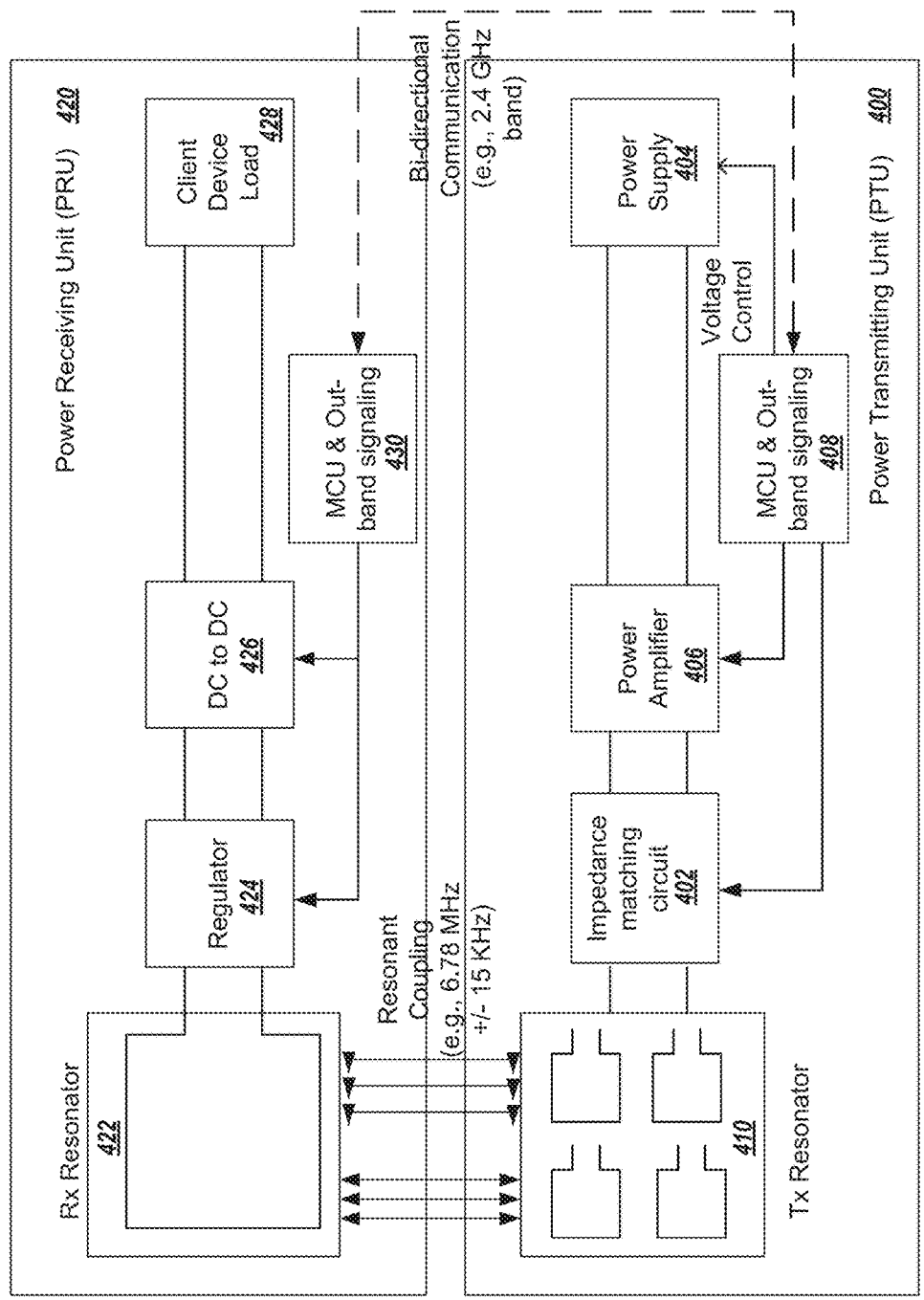
FIG. 4 is a block diagram of an impedance matching circuit in a power transmitting unit (PTU) used in a first wireless standard interface according to one implementation.

FIG. 4 is a block diagram of an impedance matching circuit 402 in a power transmitting unit (PTU) 400 used in a first wireless standard interface according to one implementation. The PTU 400 includes a power supply 404, a power amplifier 406, and a microcontroller unit (MCU) and out-band signaling unit 408. The power supply 404 supplies power to the power amplifier 406 under the control of the MCU and out-band signaling unit 408. For example, the MCU can control the power supply using voltage control. The power amplifier 406 amplifies the power to be transferred by a transmit (Tx) resonator 410. As described herein the Tx resonator 410 includes multiple transmitter coils. Although four coils are illustrated in FIG. 4, in other implementations, other number of multiple coils can be used. Different combinations of transmitter coils can be selected to transfer power to a power receiving unit (PRU) 420. The transmitter coils may be PTU coils. Impedance matching circuit 402 provides impedance matching of the Tx resonator 410 and the power amplifier 406. The impedance matching circuit 402 maintains impedance constant on output terminals of the power amplifier 406 regardless of which combination of primary coils 510 is selected to transfer power. The impedance matching circuit 402 may include switching circuitry and bypass signaling paths as described above with respect to FIGS. 2A-3B. The bypass signaling paths are conductive paths whose individual electrical characteristics match those of the corresponding transmitter coils.

The MCU and out-band signaling unit 408 may determine a first subset of the transmitter coils of TX resonator 410 to transfer wireless power and a second subset of the transmitter coils that does not transfer wireless power. The MCU can determine the second subset as the remaining transmitter coils that are not in the first subset. Alternatively, the MCU can specifically identify which transmitter coils are selected for the first subset and specifically identify which transmitter coils are not selected for the second subset. The MCU switches the first subset of transmitter coils and a third subset of the conductive traces into series between the first terminal and the second terminal of the power amplifier 406. The third subset of the conductive paths corresponds to the second subset of the transmitter coils, which are not selected to transmit wireless power. The MCU can switch the respective ones of the transmitter coils and the respective ones of the conductive paths using the switching circuitry in the impedance matching circuit 402. For example, the MCU may send one or more signals to the switching circuitry to select individual transmitter coils to transfer power and may send one or more signals to the switching circuitry to select individual conductive paths corresponding to the transmitter coils that are not selected to transfer power. In this manner, the impedance matching circuit 402 can maintain impedance across the terminals of the power amplifier 406 regardless of which ones of the transmitter coils are selected to transfer power.

In some implementations, the MCU and out-band signaling unit 408 can also provide bi-directional communication (e.g., 2.4 GHz band) between the PTU 400 and the PRU 420. In other implementations, the MCU and out-band signaling unit 408 includes a processing device to control the power amplifier and the power supply 404 and a separate integrated circuit to handle the bi-directional communication with the PRU 420. The processing device may be a microcontroller, a microprocessor, a processor, or the like. The out-band signaling unit may be any circuitry, processing device, or other logic that can implement functionality of a wireless modules. For example, the out-band signaling unit may include a RF module, such as a personal area network (PAN) module, or the like. For example, the RF module may be an integrated circuit that implements the bluetooth technology. Alternatively, other RF technologies may be used for the out-band signaling. In one implementation, a Bluetooth Smart link is defined in the first interface standard that is intended for control of power levels, identification of valid loads and protection of non-compliant devices, or the like.

To transfer power, the PTU 400 converts power from the power supply 404 into a time-varying electromagnetic field by one or more of the PTU coils of the Tx resonator 410. The electromagnetic field creates a resonant coupling (e.g., 6.78 MHz+/=15 kHz) between the Tx resonator 410 and a receiver (Rx) resonator 422 of the PRU 420. The Rx resonator 422 may include a receiver coil. The PRU 420 receives the power via the Rx resonator 422 and converts it back to DC or AC electrical power for consumption by a client device load 428. For example, the PRU 420 may include a regulator 424 and DC to DC converter 426 to convert the power received from the PTU 400 into DC power for the client device load 428. Alternatively, other components may be used to convert the received power to usable power by the client device load 428.

In one implementation, the PTU 400 is designed to comply with the AirFuel® standard by the AirFuel® Alliance. In another implementation, the PTU 400 can be used in other interface standards to transfer power wirelessly.

Figure 5:
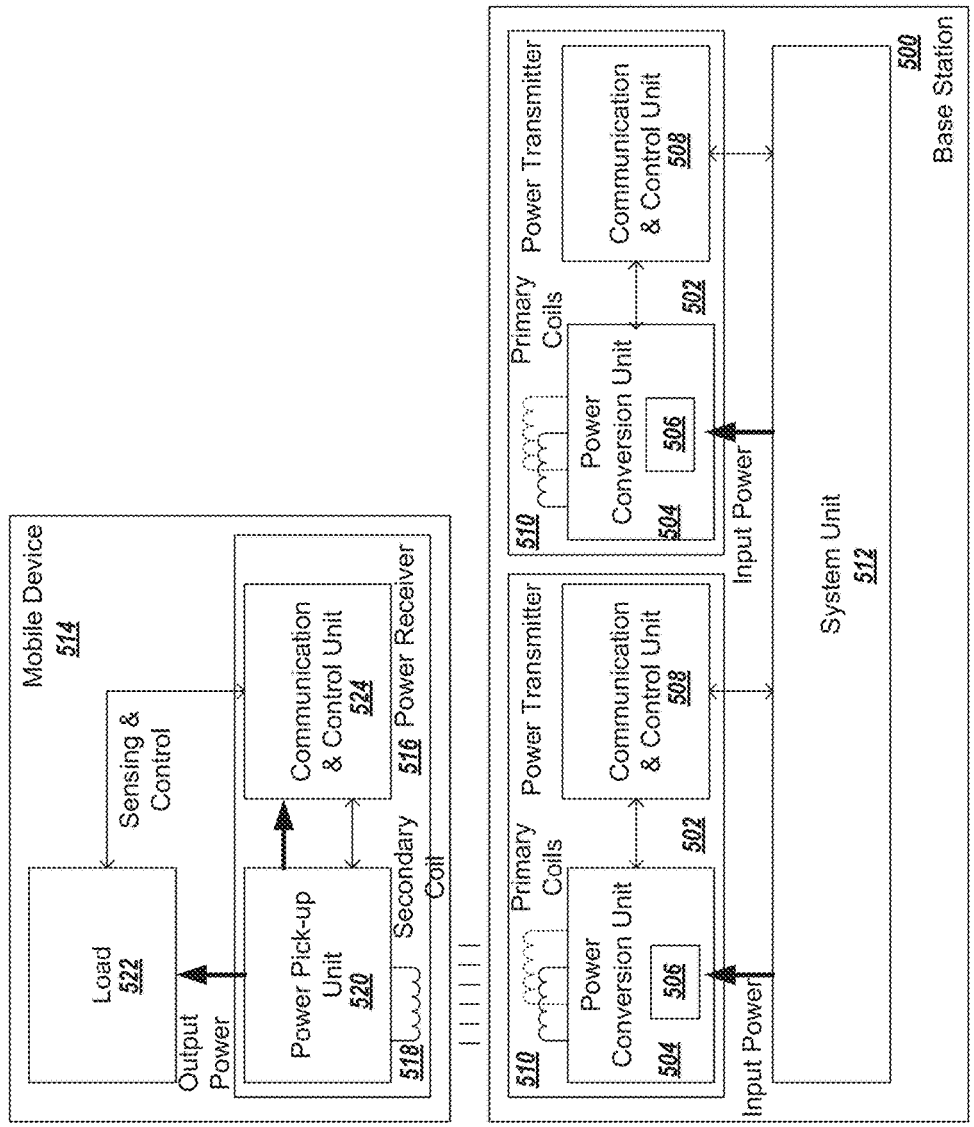
FIG. 5 is a block diagram of an impedance matching circuit in a base station used in a second wireless standard interface according to one implementation.

FIG. 5 is a block diagram of an impedance matching circuit 506 in a base station 500 used in a second wireless standard interface according to one implementation. The base station 500 includes a power supply (not illustrated) and one or more power transmitters 502. Each of the one or more power transmitters 502 includes a power conversion unit 504, impedance matching circuit 506, a communication and control unit 508, and one or more primary coils 510. The impedance matching circuit 506 maybe implemented in the power conversion unit 504. The impedance matching circuit 506 may be implemented outside the power conversion unit 504. The communication and control unit 508 can regulate the transferred power to a level that a power receiver requests. The communication and control unit 508 may be configured to control operations of the impedance matching circuit 506 to match an impedance of one or more of the primary coils 510 to the power conversion unit 504. The impedance matching circuit 506 maintains impedance constant on an output terminal of the power conversion unit 504 regardless of which combination of primary coils 510 of the power transmitter 502 is selected to transfer power. The impedance matching circuit 506 may include switching circuitry and bypass signaling paths as described above with respect to FIGS. 2A-3B. The bypass signaling paths are conductive paths whose individual electrical characteristics match those of the corresponding primary coils.

The communication and control unit 508 may determine a first subset of the transmitter coils 510 to transfer wireless power and a second subset of the transmitter coils that does not transfer wireless power. The communication and control unit 508 can determine the second subset as the remaining transmitter coils that are not in the first subset. Alternatively, the communication and control unit 508 can specifically identify which transmitter coils are selected for the first subset and specifically identify which transmitter coils are not selected for the second subset. The communication and control unit 508 switches the first subset of transmitter coils and a third subset of the conductive traces into series between the first terminal and the second terminal of the power conversion unit 504. The third subset of the conductive paths corresponds to the second subset of the transmitter coils, which are not selected to transmit wireless power. The communication and control unit 508 can switch the respective ones of the transmitter coils and the respective ones of the conductive paths using the switching circuitry in the impedance matching circuit 506. For example, the communication and control unit 508 may send one or more signals to the switching circuitry to select individual transmitter coils to transfer power and may send one or more signals to the switching circuitry to select individual conductive paths corresponding to the transmitter coils that are not selected to transfer power. In this manner, the impedance matching circuit 506 can maintain impedance across the terminals of the power conversion unit 506 regardless of which ones of the transmitter coils are selected to transfer power.

In some implementations, such as when there are more than one power transmitters 502, the base station 500 may include a system unit 512 that coordinates operations of the multiple power transmitters 502. The system unit 512 may include various functionality of the base station 500, such as input power provisioning, control of multiple power transmitters 502, and user interfacing. The system unit 512 may provide input power to the multiple power conversion units 504. The power conversion unit 504 is to convert power from the power supply into an oscillating magnetic field by one or more of the primary coils 510. The primary coils 510 are considered transmitter coils, as described herein. In this implementation, the impedance matching circuit 506 is implemented in each of the power transmitters 502. In other implementations, one impedance matching circuit 506 can be used to impedance match for the primary coils of the multiple power transmitters 502.

Although two primary coils are illustrated in FIG. 5, in other implementations, other number of multiple coils can be used. Different combinations of transmitter coils can be selected to transfer power to a power receiver 516 of a mobile device 514.

The power receiver 516 includes a power pick-up unit 520, a communication and control unit 524, and a secondary coil 518. Similar to the power conversion unit 504 of the power transmitter 502, the secondary coil 518 captures the magnetic field of the power pick-up unit 520. The power pick-up unit 520 typically contains a single receiving coil only and the mobile device 514 typically contains a single power receiver. The communications and control unit 524 regulates the transferred power to the level that is appropriate for a load 522. The load 522 may be a battery coupled to the output of the power receiver 516. The load 522 may also be other subsystems of the mobile device 514. More specifically, the power pick-up unit 520 receives the transmitted power via the secondary coil 518 and converts the power into an output power for the load 522. The communication and control unit 524 can control the power pick-up unit 520 and sense the output power to the load 522.

In one implementation, the base station 500 is designed to comply with the Qi standard by the Wireless Power Consortium. During operation, a mobile device is placed on top of the base station (e.g., a power transmission pad), which charges the mobile device via resonant inductive coupling. In other systems, the base station can wirelessly charge a mobile device using inductive coupling, resonant coupling, or both. In another implementation, the base station 500 can be used in other interface standards to transfer power wirelessly.

The implementations described in FIGS. 1-5 are directed to wireless power transmitters of wireless chargers. In other implementations, the impedance matching circuit can be used in connection with a wireless transmitter that is used for transferring data, or transferring both data and power. For example, the impedance matching circuit, as described herein, may be used in a NFC device. NFC is a set of communication protocols used to establish communication between two enabled-devices by bringing them within a specified distance of each other.

Figure 6:
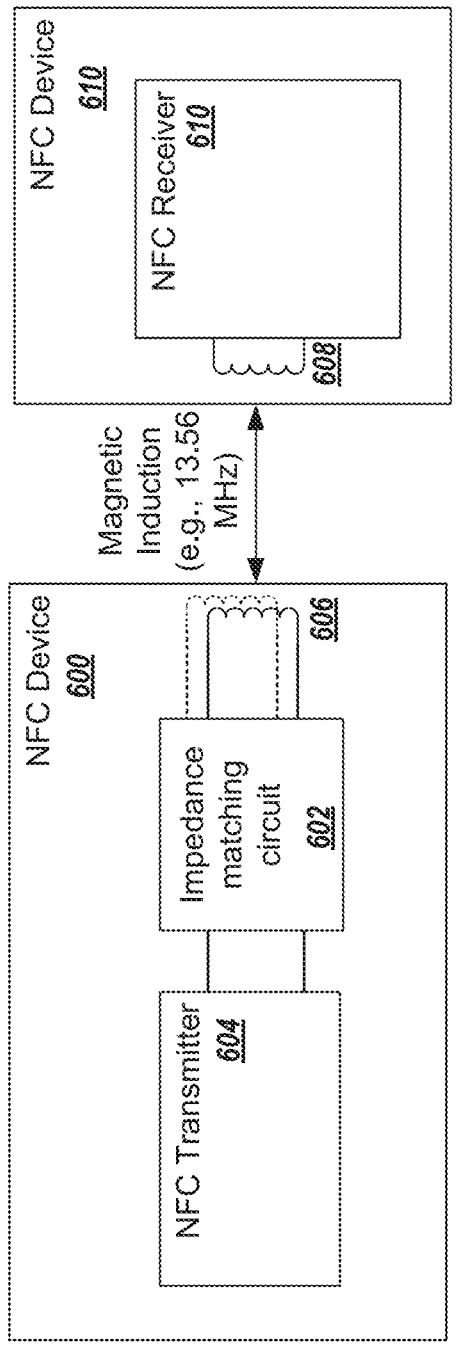
FIG. 6 is a block diagram of an impedance matching circuit in a near field communication (NFC) device used in a third wireless standard interface according to one implementation.

FIG. 6 is a block diagram of an impedance matching circuit 602 in a NFC device 600 used in a third wireless standard interface according to one implementation. The NFC device 600 includes a NFC transmitter 604 that generates an RF field to transfer data using magnetic induction between one or more transmitter coils 606 and a receiver coil 608 of another device 610. NFC uses magnetic induction between two coils (e.g., two loop antennas) located within each other's near field. The devices may operate at 13.56 MHz within a globally available and unlicensed RF ISM band, effectively forming an air-core transformer. It operates within the globally available and unlicensed radio frequency ISM band of 13.56 MHz. Alternatively, the impedance matching circuit 602 can be implemented in other designated near field communication frequency bands. The impedance matching circuit 602 maintains an impedance of the NFC transmitter 604 regardless of which combination of transmitter coils 606 is selected to transfer data. In some implementations, the NFC transmitter 604 can transfer data and power. The impedance matching circuit 602 may include switching circuitry and bypass signaling paths as described above with respect to FIGS. 2A-3B. The bypass signaling paths are conductive paths whose individual electrical characteristics match those of the corresponding transmitter coils.

In various implementations described herein, the impedance matching circuit is described and illustrated with respect to transmitter coils. In other implementations, the impedance matching circuit may be used in connection with receiver coils. In particular, a receiving device includes a power supply; a wireless receiver coupled to the power supply, the wireless receiver comprising a first terminal and a second terminal; a first receiver coil comprising a first impedance; a second receiver coil, the second receiver coil comprising a second impedance; and an impedance matching circuit coupled to the first terminal and the second terminal. The impedance matching circuit comprises a first conductive path comprising a first conductive path comprises a third impedance to match the first impedance; and a second conductive path comprising a fourth impedance to match the second impedance; first switching circuitry coupled to the first receiver coil and the first conductive path; and second switching circuitry coupled to the second receiver coil and the second conductive path. The first switching circuitry, in response to a first control signal, is to switch either the first receiver coil or the first conductive path in series between the first terminal and the second terminal. The second switching circuitry, in response to a second control signal, is to switch either the second receiver coil or the second conductive path in series between the first terminal and the second terminal.

Figure 7:
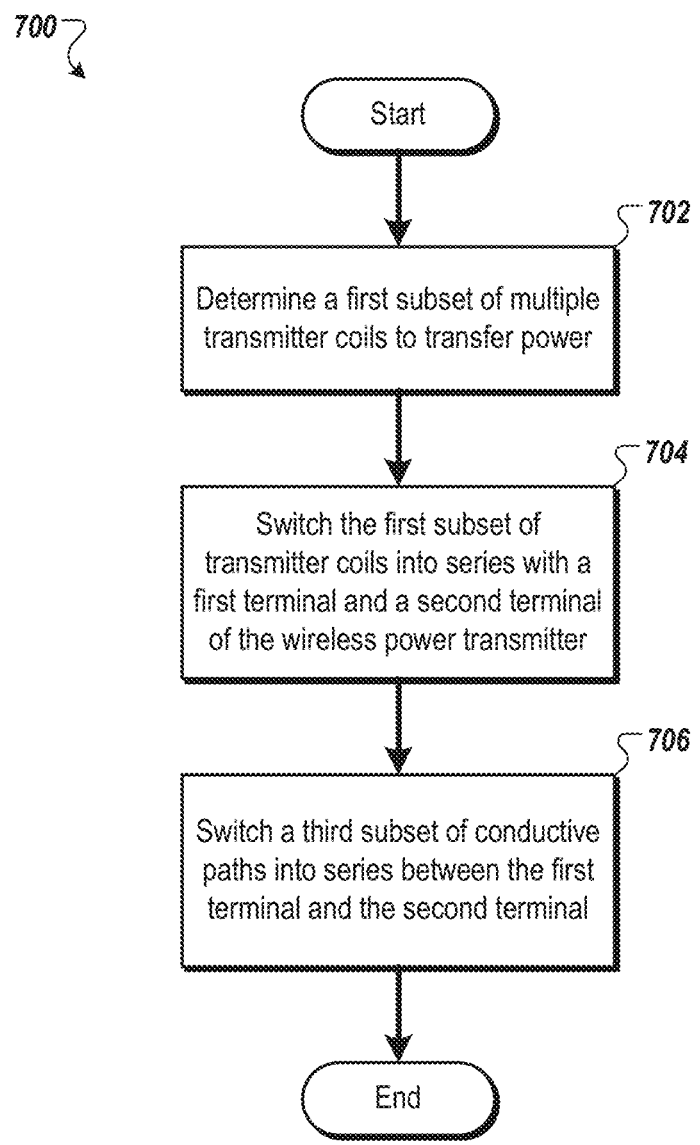
FIG. 7 is a flow diagram of a method of impedance matching multiple transmitter coils of an electronic device according to one implementation.

FIG. 7 is a flow diagram of a method 700 of impedance matching multiple transmitter coils of an electronic device according to one implementation. The method 700 maybe performed by processing logic comprising hardware, software, firmware, or any combination thereof. In one implementation, the controller 108 of FIG. 1 performs the method 700. In another implementation, the MCU and out-band signaling unit 408 performs the method 700. In another implementation, the communication and control unit 508 performs the method 700. Alternatively, the method 700 may be performed by other processing elements of an electronic device, such as the wireless chargers and transmitting devices described herein.

Referring to FIG. 7, the method 700 begins by the processing logic determining a first subset of multiple transmitter coils to transfer wireless power (block 702). It should be noted that the multiple transmitter coils can be used to transfer wireless power, data, or both. By determining the first subset, a second subset may include those transmitters that are not selected to transfer wireless power, data, or both. The determination of the first subset may be triggered in response to another process of the processing logic. For example, the processing logic may receive an indication that a mobile device is placed in proximity to a wireless charger to charge a battery of the mobile device. Alternatively, the processing logic may detect a receiver requesting transfer of data, power, or both. In another implementation, the processing logic may receive an indication that a transmitter is to transmit power and then determines which transmitter coils are to transfer data, power, or both, as the first subset. At block 704, the processing logic switches the first subset of transmitter coils into series between a first terminal and a second terminal of a wireless transmitter (e.g., a wireless power transmitter of a wireless charger). This can be done by the processing logic sending one or more control signals to corresponding switching circuitry as described herein. At block 706, the processing logic switches a third subset of conductive paths into series between the first terminal and the second terminal of the wireless transmitter. The third subset of conductive paths corresponds to the second subset of the transmitter coils (i.e., those transmitter coils that were not selected to transmit power, data, or both). This can be done by the processing logic sending one or more control signals to corresponding switching circuitry as described herein. The method 700 can return to another process after transmission of the data, power, or both. Alternatively, the method 700 can return to determine if additional data, power, or both needs to be transferred to the receiver. For example, the processing logic may receive an indication that a different combination of transmitter coils is to be used to transfer data, power, or both. The processing logic can determine which of the transmitter coils are to be used. The processing logic selects corresponding conductive paths for the non-selected transmitter coils to maintain impedance, as described herein.

In another implementation, the processing logic performs another method in which the processing logic is implemented in a wireless charger and determines a first combination of transmitter coils to transfer power wireless to another device. The processing logic selects the first combination of transmitter coils to be disposed in series in a between terminals of a power conversion unit or a power amplifier. For the non-selected transmitter coils, the processing logic selects corresponding bypass signaling paths to be disposed in series with the selected transmitter coils. The selected bypass signaling paths present an impedance that the respective transmitter coil would present were it selected to be disposed in series with the other selected transmitter coils, if any. The processing logic of the wireless charger may transfer electrical power wirelessly according to a wireless interface standard, such as those described herein. The processing logic can control circuitry to convert power from the power supply into a time-varying electromagnetic field by one or more of the transmitter coils. In another implementation, the processing logic can control circuitry to convert the power form the power supply into an oscillating magnetic field by one or more transmitter coils. In another implementation, the processing logic can control circuitry to convert the power from the power supply into a RF field used to communicate data, power, or both.

In some implementations, the processing logic controls switching circuitry to switch an inductor component on the bypass signaling path into series, instead of the corresponding transmitter coil. In another implementation, the processing logic controls switching circuitry to switch an electrical short into series, instead of the corresponding transmitter coil. In these implementations, a capacitor component may be disposed in series with the transmitter coil as described herein.

In another method, processing logic can control switching circuitry to switch a first transmitter coil in series with a second transmitter coil in a first transmit mode, as well as switch the first transmitter coil in series with a second bypass signaling path in a second transmit mode. The processing logic can control switching circuitry to switch a first bypass signaling path in series with the second transmitter coil in a third transmit mode. The first bypass signaling path has the same impedance as the first transmitter coil and the second bypass signaling path has the same impedance as the second transmitter coil. The first bypass signaling path and the second bypass signaling path may have inductor components. Alternatively, the first bypass signaling path and the second bypass signaling path may have no discrete components, operating as electrical shorts. In some cases, a discrete capacitor (or other capacitive component) is disposed in series with the first transmitter coil when the first bypass signaling path is an electrical short. Similarly, a discrete capacitor (or other capacitive component) is disposed in series with the second transmitter coil when the second bypass signaling path is an electrical short.

The description below with respect to FIGS. 8-9 describes two simulation cases where a set of three transmitter coils and corresponding bypass signaling paths with inductors are arranged in two different coil arrangements. The simulation cases show the impedance matching regardless of the coil arrangement as described herein.

Figure 8:
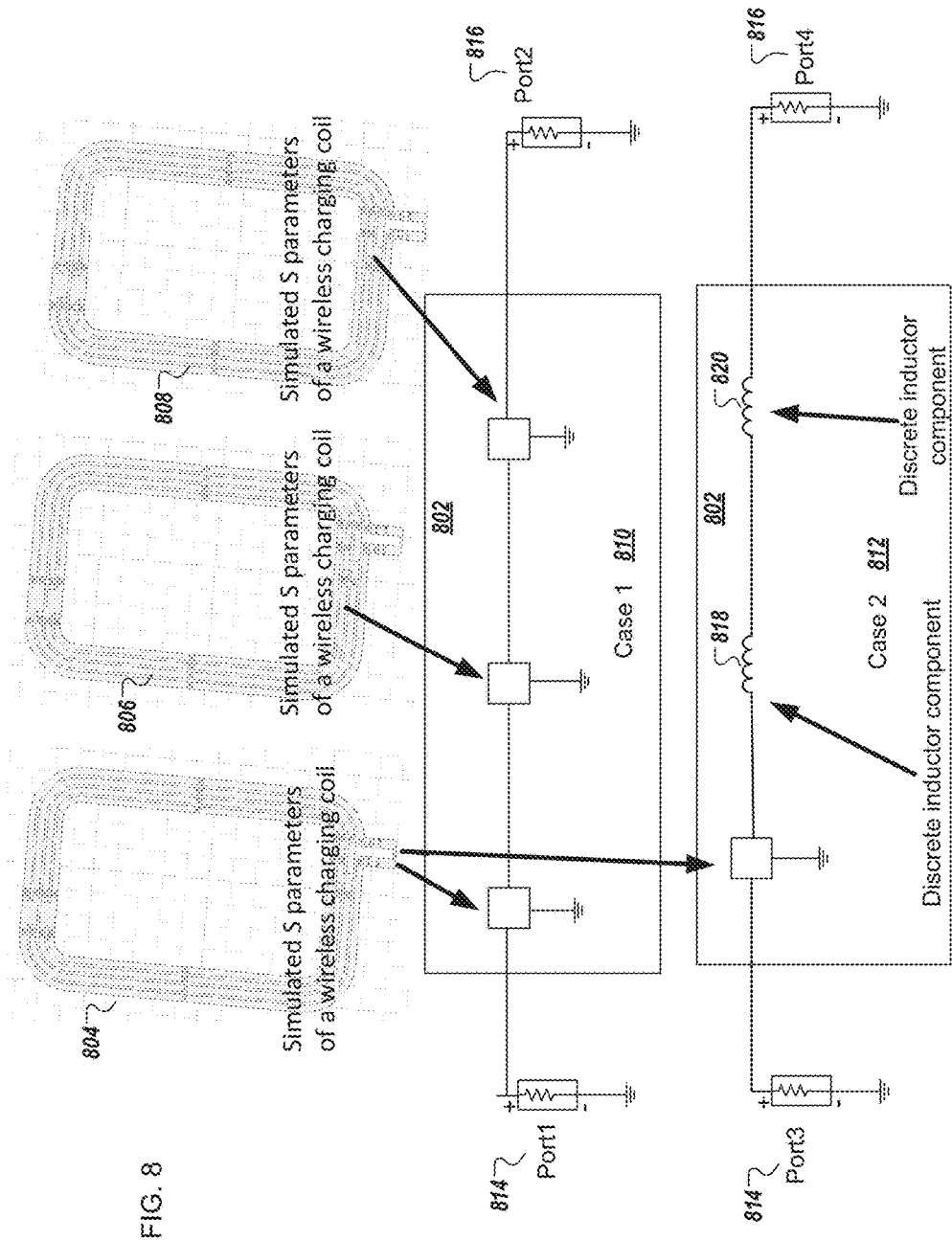
FIG. 8 is a schematic diagram of an impedance matching circuit and three transmitter coils in a first simulation case and in a second simulation case.

FIG. 8 is a schematic diagram of an impedance matching circuit 802 and three transmitter coils 804-808 in a first simulation case 810 and in a second simulation case 812. The impedance matching circuit 802 can select either a transmitter coil or a bypass signaling path, such as a bypass signaling path with an inductor component disposed thereon. Alternatively, the bypass signaling path may be an electrical short path, as described herein. In the first simulation case 810, the impedance matching circuit 802 selects the three transmitter coils 804-808 to wirelessly transfer power. The three transmitter coils 804-808 are connected in series between a first terminal 814 (labeled as "port 1") and a second terminal 816 (labeled as "port 2") of a wireless power transmitter (not illustrated in FIG. 8). In the second simulation case 812, the impedance matching circuit 802 selects the first transmitter coils 804 and selects a second bypass signaling path 818 and a third bypass signaling paths 820 to wirelessly transfer power. The first transmitter coil 804 and the second bypass signaling path 818 and a third bypass signaling paths 820 are connected in series between the first terminal 814 (labeled as "port 3" for graphing purposes) and the second terminal 816 (labeled as "port 4" for graphing purposes).

Figure 9:
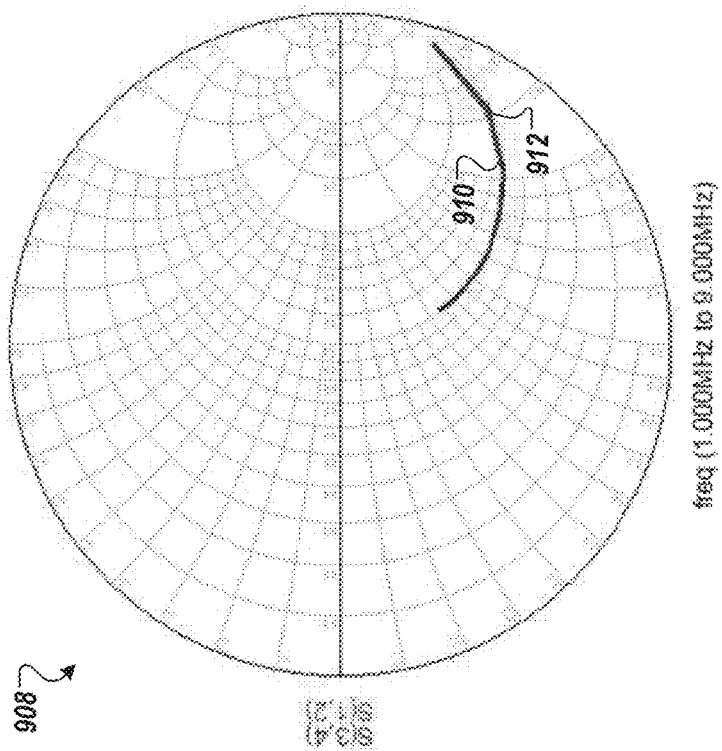
FIG. 9 illustrates impedance curves on Smith charts of the first simulation case and the second simulation case of FIG. 8 according to one implementation.
Figure 9:
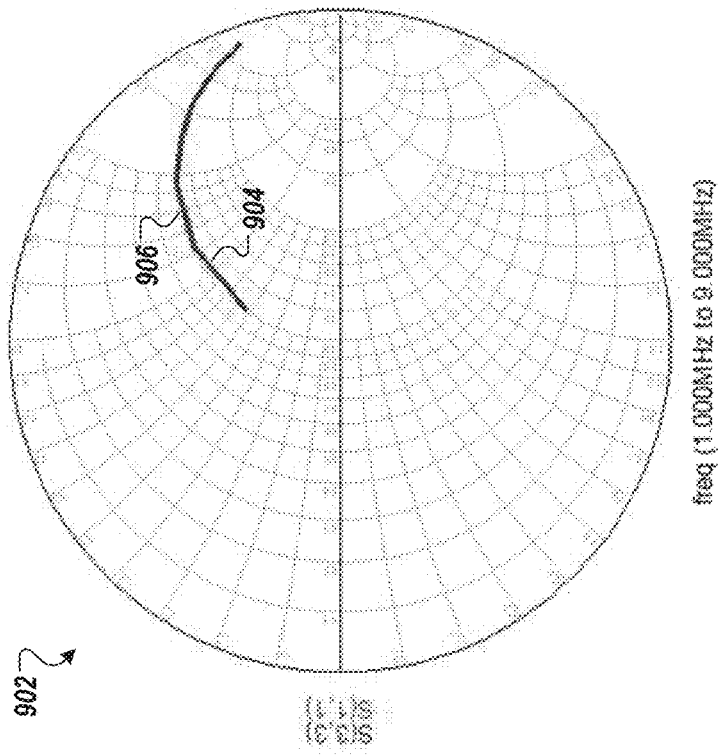

FIG. 9 illustrates impedance curves on Smith charts of the first simulation case and the second simulation case of FIG. 8 according to one implementation. The Smith chart 902 illustrates a simulated S-parameter 904 at the first terminal 814 in the first simulation case 810 (S(1,1)) and a simulated S-parameter 906 at the first terminal 814 in the second simulation case 812 (S(3,3)). The simulated S-parameter 904 and the simulated S-parameter 906 represent the reflection coefficients seen by the wireless power transmitter in the first simulation case 810 and in the second simulation case 820. The Smith chart 908 illustrates a simulated S-parameter 910 between the first terminal 814 and the second terminal 816 in the first simulation case 810 (S(1,2)) and a simulated S-parameter 906 between the first terminal 814 and the second terminal 816 in the second simulation case 812 (S(3,4)). In the first simulation case 810, the S-parameter response is the same or similar to the S-parameter response in the second simulation case 812 812 in which two of the transmitter coils have been replaced with discrete inductor components with an inductance value (e.g., 1690 nH). The simulation results show the similarity and correlation between the S-parameter responses in both simulation cases.

Using the impedance matching circuit described herein, no complex impedance matching circuit or impedance tuner are needed between the transmitter coils and the wireless power transmitter to compensate for impacts of re-configuring the transmitter coils in different arrangements. These implementations may result in better charging efficiency as a result of no losses (or minimal loss) from the re-configurable coil matching circuit. The impedance matching circuit may result in fewer components in the wireless charger. The impedance matching circuit may provide better thermal performance as a result of no losses (or minimal loss) from the re-configurable coil matching circuit. The impedance matching circuit may result in better performance in terms of harmonics since the circuitry includes less non-linear components of a complex impedance tuner or matching circuitry as done conventionally. Also, an impedance tuner would need closed loop control, and the impedance matching circuit can eliminate the need for closed loop control.

The following examples pertain to further embodiments.

Example 1 is a wireless charger configured for impedance matching multiple transmitter coils for power management in a mobile device, the wireless charger comprising: a power supply; a wireless power transmitter coupled to the power supply, the wireless power transmitter comprising a first terminal and a second terminal; a plurality of transmitter coils comprising a first subset of transmitter coils and a second subset of transmitter coils; a plurality of conductive paths; switching circuitry coupled to the plurality of transmitter coils and the plurality of conductive path; and a controller coupled to the switching circuitry, the controller to: determine a first subset of transmitter coils that transfers wireless power, and a second subset of transmitter coils that does not transfer wireless power; switch the first subset of transmitter coils into series between the first terminal and the second terminal of the wireless power transmitter; and switch a third subset of the plurality of conductive paths into series between the first terminal and the second terminal of the wireless power transmitter, wherein the third subset of the plurality of conductive paths corresponds to the second subset of transmitter coils.

In Example 2, the subject matter of Example 1, the wireless charger is a power transmitting unit (PTU) to transfer electrical power wirelessly according to a wireless interface standard, and wherein the PTU is to convert power from the power supply into a time-varying electromagnetic field by one or more of the plurality of transmitter coils.

In Example 3, the subject matter of any one of Examples 1-2, the wireless charger is a base station to transfer electrical power wirelessly according to a wireless interface standard, wherein the base station is to convert power from the power supply into an oscillating magnetic field by one or more of the plurality of transmitter coils.

In Example 4, the subject matter of any one of Examples 1-3, individual ones of the plurality of conductive paths correspond to individual ones of the plurality of transmitter coils, wherein impedances of the individual ones of the plurality of conductive paths match impedances of the individual ones of the plurality of transmitter coils.

In Example 5, the subject matter of any one of Examples 1-4, at least one of the plurality of conductive paths comprises an inductor component, the inductor component having a same inductance as a respective one of the plurality of transmitter coils.

In Example 6, the subject matter of any one of Examples 1-5, the wireless charger further comprising a capacitor component coupled in series with one of the plurality of conductive paths.

Example 7 is an apparatus comprising: a power supply; a wireless transmitter or receiver coupled to the power supply, the wireless transmitter or receiver comprising a first terminal and a second terminal; a first coil comprising a first impedance; a second coil comprising a second impedance; a controller to process control signals; and an impedance matching circuit coupled to the first terminal and the second terminal, wherein the impedance matching circuit comprises: a first conductive path comprising a third impedance to match the first impedance; a second conductive path comprising a fourth impedance to match the second impedance; first switching circuitry coupled to the first coil and the first conductive path, wherein the first switching circuitry, in response to a first control signal from the controller, is to switch either the first coil or the first conductive path in series between the first terminal and the second terminal; and second switching circuitry coupled to the second coil and the second conductive path, wherein the second switching circuitry, in response to a second control signal from the controller, is to switch either the second coil or the second conductive path in series between the first terminal and the second terminal.

In Example 8, the subject matter of Example 7, the first switching circuitry further comprises: a first single pole, double throw (SPDT) switch with a first terminal, a second terminal, and a third terminal; a second SPDT switch with a first terminal, a second terminal, and a third terminal; wherein the first coil is coupled between the second terminal of the first SPDT switch and the second terminal of the second SPDT switch, wherein the first conductive path is coupled between the third terminal of the first SPDT switch and the third terminal of the second SPDT switch, wherein the first terminal of the first SPDT switch is coupled to the first terminal of the wireless transmitter or receiver; a third SPDT switch with a first terminal, a second terminal, and a third terminal; and a fourth SPDT switch with a first terminal, a second terminal, and a third terminal, wherein the second coil is coupled between the second terminal of the third SPDT switch and the second terminal of the fourth SPDT switch, wherein the second conductive path is coupled between the third terminal of the third SPDT switch and the third terminal of the fourth SPDT switch, wherein the first terminal of the third SPDT switch is coupled to the first terminal of the second SPDT, and wherein the first terminal of the fourth SPDT switch is coupled to the second terminal of the wireless transmitter or receiver.

In Example 9, the subject matter of any one of Examples 7-8, the first switching circuitry further comprises: a first inductor component disposed on the first conductive path; and a second inductor component disposed on the second conductive path.

In Example 10, the subject matter of any one of Examples 7-9, the first switching circuitry further comprises: a first capacitor component disposed in series with the first coil; and a second capacitor component disposed in series with the second coil.

In Example 11, the subject matter of any one of Examples 7-10, the first switching circuitry further comprises: a first capacitor component disposed in series with the first coil; and a second capacitor component disposed in series with the second coil, wherein the first conductive path is an electrical short path.

In Example 12, the subject matter of any one of Examples 7-11, the first switching circuitry further comprises a first single pole, double throw (SPDT) switch with a first terminal, a second terminal, and a third terminal; wherein the first coil is coupled to the second terminal of the first SPDT switch, wherein the first conductive path is coupled to the third terminal of the first SPDT switch, wherein the first terminal of the first SPDT switch is coupled to the first terminal of the wireless transmitter or receiver; and the second switching circuitry comprises a second SPDT switch with a first terminal, a second terminal, and a third terminal, wherein the second coil is coupled to the second terminal of the second SPDT switch, wherein the second conductive path is coupled to the third terminal of the second SPDT switch, and wherein the first terminal of the second SPDT switch is coupled to the first conductive path and the first coil.

In Example 13, the subject matter of any one of Examples 7-12, the wireless transmitter or receiver is a wireless power transmitter, wherein the first coil is a first transmitter coil and the second coil is a second transmitter coil.

In Example 14, the subject matter of any one of Examples 7-13, the wireless power transmitter is a power transmitting unit (PTU), wherein the PTU comprises: the power supply; the wireless power transmitter comprising a power amplifier and a processing device coupled to the power amplifier and the power supply; and the impedance matching circuit, wherein the first transmitter coil and the second transmitter coil are PTU coils, wherein the PTU is to convert power from the power supply into a time-varying electromagnetic field by one or more of the PTU coils.

In Example 15, the subject matter of any one of Examples 7-14, the wireless power transmitter is a base station, wherein the base station comprises: the power supply; the wireless power transmitter comprising a power conversion unit and a communication and control unit, wherein the power conversion unit is coupled to the power supply and the communication and control unit; and the impedance matching circuit, wherein the base station is to convert power from the power supply into an oscillating magnetic field by one or more of the first transmitter coil and the second transmitter coil.

In Example 16, the subject matter of any one of Examples 7-15, the apparatus further comprises a first series capacitor, a second series capacitor, a third series capacitor, and a fourth series capacitor, wherein: the first coil is disposed between the first series capacitor and the second series capacitor; the second coil is disposed between the third series capacitor and the fourth series capacitor; the first switching circuitry further comprises a first single pole, single throw (SPST) switch disposed on the first conductive path between a first node and a second node, the first node being coupled to the first series capacitor and the second node being coupled to the second series capacitor; the second switching circuitry comprises a second SPST switch disposed on the second conductive path between a third node and a fourth node, the third node being coupled to the third series capacitor and the fourth node being coupled to the fourth series capacitor; and the second node is coupled to the third node.

In Example 17, the subject matter of any one of Examples 7-16, the wireless transmitter or receiver is a near field communication (NFC) transmitter, wherein the first coil is a first transmitter coil and the second coil is a second transmitter coil, wherein the NFC transmitter is to generate a radio frequency (RF) field to transfer data using magnetic induction between a receiver coil of another device and one or more of the first transmitter coil and the second transmitter coil.

Example 18 is an electronic device comprising: a power supply; a wireless power transmitter coupled to the power supply, the wireless power transmitter comprising a first terminal and a second terminal; and a plurality of power transfer circuits, wherein a first power transfer circuit comprises a first transmitter coil and a first bypass signaling path, wherein the first bypass signaling path comprises a first impedance to match a second impedance of the first transmitter coil, wherein a second power transfer circuit comprises a second transmitter coil and a second bypass signaling path, wherein the second bypass signaling path comprises a third impedance to match a fourth impedance of the second transmitter coil, and wherein the plurality of power transfer circuits are coupled in series between the first terminal and the second terminal.

In Example 19, the subject matter of Example 18, the electronic device further comprises: a controller coupled to the plurality of power transfer circuits, the controller to: switch the first transmitter coil in series with the second transmitter coil in a first transmit mode; and switch the first transmitter coil in series with the second bypass signaling path in a second transmit mode.

In Example 20, the subject matter of any one of Examples 18-19, the controller is further to switch the first bypass signaling path in series with the second transmitter coil in a third transmit mode.

In Example 21, the subject matter of any one of Examples 18-20, the electronic device further comprises: a first inductor component disposed on the first bypass signaling path; and a second inductor component disposed on the second bypass signaling path.

In Example 22, the subject matter of any one of Examples 18-21, the electronic device further comprises a first capacitor component disposed in series with the first transmitter coil; and a second capacitor component disposed in series with the second transmitter coil, wherein the first bypass signaling path and the second bypass signaling path are electrical short paths.

Various embodiments can have different combinations of the structural features described above. For instance, all optional features of the computing system described above can also be implemented with respect to the method or process described herein and specifics in the examples can be used anywhere in one or more embodiments.

Example 23 is a method for impedance matching multiple transceiver coils used in power management of a mobile device, the method comprising: coupling a first transceiver coil having a first impedance and a second transceiver coil having a second impedance to a power supply; coupling an impedance matching circuitry to output terminals of the first transceiver coil using a first switching circuitry and a first conductive path having a third impedance to match the first impedance; coupling the impedance matching circuitry to output terminals of the second transceiver coil using a second switching circuitry and a second conductive path having a fourth impedance to match the second impedance; in response to a first power management control signal, adjusting the first switching circuitry to switch either the first transceiver coil or the first conductive path in series between the output terminals so that the first transceiver coil and the first conductive path have the same impedance; and in response to a second power management control signal, adjusting the second switching circuitry to switch either the second transceiver coil or the second conductive path in series between the output terminals so that the second transceiver coil and the second conductive path have the same impedance.

In Example 24, the subject matter of Example 23, the first transceiver coil is a first transmitter coil and the second transceiver coil is a second transmitter coil.

Example 25 is an apparatus comprising means to perform a method as claimed in any preceding claim.

Example 26 is at least one machine readable medium comprising a plurality of instructions, when executed, to implement a method or realize an apparatus as claimed in any preceding claim.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of the various implementations.

A module as used herein refers to any combination of hardware, software, and/or firmware. As an example, a module includes hardware, such as a microcontroller or other processing element, associated with a non-transitory medium to store code adapted to be executed by the microcontroller. Therefore, reference to a module, in one implementation, refers to the hardware, which is specifically configured to recognize and/or execute the code to be held on a non-transitory medium. Furthermore, in another implementation, use of a module refers to the non-transitory medium including the code, which is specifically adapted to be executed by the microcontroller to perform predetermined operations. And as can be inferred, in yet another implementation, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one implementation, use of the term logic includes hardware, such as transistors, registers, or other hardware, such as programmable logic devices.

Use of the phrase 'to' or 'configured to,' in one implementation, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one implementation, refers to some apparatus, logic, hardware, and/or element designed in such a way to enable use of the apparatus, logic, hardware, and/or element in a specified manner. Note as above that use of to, capable to, or operable to, in one implementation, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one implementation, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one implementation, refer to a default and an updated value or state, respectively. For example, a default value potentially includes a high logical value, i.e. reset, while an updated value potentially includes a low logical value, i.e. set. Note that any combination of values may be utilized to represent any number of states.

The implementations of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform any of the implementations may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one implementation" or "an implementation" means that a particular feature, structure, or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the implementations as set forth in the appended claims. The specification and drawings are, accordingly, to be regarded in an illustrative sense rather than a restrictive sense. Furthermore, the foregoing use of implementation and other exemplarily language does not necessarily refer to the same implementation or the same example, but may refer to different and distinct implementations, as well as potentially the same implementation.

What is claimed is:

1. An apparatus comprising:
   a power supply;
   a wireless transmitter or receiver coupled to the power supply, the wireless transmitter or receiver comprising a first terminal and a second terminal;
   a first coil comprising a first impedance;
   a second coil comprising a second impedance;
   a controller to process control signals; and
   an impedance matching circuit coupled to the first terminal and the second terminal, wherein the impedance matching circuit comprises:
      a first conductive path comprising a third impedance to match the first impedance;
      a second conductive path comprising a fourth impedance to match the second impedance;
      first switching circuitry coupled to the first coil and the first conductive path, wherein the first switching circuitry, in response to a first control signal from the controller, is to switch either the first coil or the first conductive path in series between the first terminal and the second terminal; and
      second switching circuitry coupled to the second coil and the second conductive path, wherein the second switching circuitry, in response to a second control signal from the controller, is to switch either the second coil or the second conductive path in series between the first terminal and the second terminal.

2. The apparatus of claim 1, wherein the first switching circuitry further comprises:
   a first single pole, double throw (SPDT) switch with a first terminal, a second terminal, and a third terminal;
   a second SPDT switch with a first terminal, a second terminal, and a third terminal; wherein the first coil is coupled between the second terminal of the first SPDT switch and the second terminal of the second SPDT switch, wherein the first conductive path is coupled between the third terminal of the first SPDT switch and the third terminal of the second SPDT switch, wherein the first terminal of the first SPDT switch is coupled to the first terminal of the wireless transmitter or receiver;
a third SPDT switch with a first terminal, a second terminal, and a third terminal; and
a fourth SPDT switch with a first terminal, a second terminal, and a third terminal, wherein the second coil is coupled between the second terminal of the third SPDT switch and the second terminal of the fourth SPDT switch, wherein the second conductive path is coupled between the third terminal of the third SPDT switch and the third terminal of the fourth SPDT switch, wherein the first terminal of the third SPDT switch is coupled to the first terminal of the second SPDT switch, and wherein the first terminal of the fourth SPDT switch is coupled to the second terminal of the wireless transmitter or receiver.

3. The apparatus of claim 2, wherein the first switching circuitry further comprises:
a first inductor component disposed on the first conductive path; and
a second inductor component disposed on the second conductive path.

4. The apparatus of claim 2, wherein the first switching circuitry further comprises:
a first capacitor component disposed in series with the first coil; and
a second capacitor component disposed in series with the second coil.

5. The apparatus of claim 2, wherein the first switching circuitry further comprises:
a first capacitor component disposed in series with the first coil; and
a second capacitor component disposed in series with the second coil, wherein the first conductive path is an electrical short path.

6. The apparatus of claim 1, wherein:
the first switching circuitry further comprises a first single pole, double throw (SPDT) switch with a first terminal, a second terminal, and a third terminal; wherein the first coil is coupled to the second terminal of the first SPDT switch, wherein the first conductive path is coupled to the third terminal of the first SPDT switch, wherein the first terminal of the first SPDT switch is coupled to the first terminal of the wireless transmitter or receiver; and
the second switching circuitry comprises a second SPDT switch with a first terminal, a second terminal, and a third terminal, wherein the second coil is coupled to the second terminal of the second SPDT switch, wherein the second conductive path is coupled to the third terminal of the second SPDT switch, and wherein the first terminal of the second SPDT switch is coupled to the first conductive path and the first coil.

7. The apparatus of claim 1, wherein the wireless transmitter or receiver is a wireless power transmitter, wherein the first coil is a first transmitter coil and the second coil is a second transmitter coil.

8. The apparatus of claim 7, wherein the wireless power transmitter is a power transmitting unit (PTU), wherein the PTU comprises:
the power supply;
the wireless power transmitter comprising a power amplifier and a processing device coupled to the power amplifier and the power supply; and
the impedance matching circuit, wherein the first transmitter coil and the second transmitter coil are PTU coils, wherein the PTU is to convert power from the power supply into a time-varying electromagnetic field by one or more of the PTU coils.

9. The apparatus of claim 7, wherein the wireless power transmitter is a base station, wherein the base station comprises:
the power supply;
the wireless power transmitter comprising a power conversion unit and a communication and control unit, wherein the power conversion unit is coupled to the power supply and the communication and control unit; and
the impedance matching circuit, wherein the base station is to convert power from the power supply into an oscillating magnetic field by one or more of the first transmitter coil and the second transmitter coil.

10. The apparatus of claim 1, further comprising a first series capacitor, a second series capacitor, a third series capacitor, and a fourth series capacitor, wherein:
the first coil is disposed between the first series capacitor and the second series capacitor;
the second coil is disposed between the third series capacitor and the fourth series capacitor;
the first switching circuitry further comprises a first single pole, single throw (SPST) switch disposed on the first conductive path between a first node and a second node, the first node being coupled to the first series capacitor and the second node being coupled to the second series capacitor;
the second switching circuitry comprises a second SPST switch disposed on the second conductive path between a third node and a fourth node, the third node being coupled to the third series capacitor and the fourth node being coupled to the fourth series capacitor; and
the second node is coupled to the third node.

11. The apparatus of claim 1, wherein the wireless transmitter or receiver is a near field communication (NFC) transmitter, wherein the first coil is a first transmitter coil and the second coil is a second transmitter coil, wherein the NFC transmitter is to generate a radio frequency (RF) field to transfer data using magnetic induction between a receiver coil of another device and one or more of the first transmitter coil and the second transmitter coil.

* * * * *